United States Patent [19]

Daughton

[11] 4,092,662
[45] May 30, 1978

[54] SENSISTOR APPARATUS

[75] Inventor: James M. Daughton, Edina, Minn.

[73] Assignee: Honeywell Inc., Minneapolis, Minn.

[21] Appl. No.: 727,737

[22] Filed: Sep. 29, 1976

[51] Int. Cl.² .................. H01L 23/56; H01L 29/66; H01L 27/04

[52] U.S. Cl. .................................. 357/28; 357/48; 357/51; 357/91; 338/7; 338/9

[58] Field of Search .......... 357/28, 48, 49, 51, 357/91; 338/7, 9

[56] References Cited

U.S. PATENT DOCUMENTS

| 3,341,754 | 9/1967 | Kellett et al. | 357/91 |
| 3,360,695 | 12/1967 | Lindmayer | 357/28 |
| 3,629,782 | 12/1971 | Sahni | 357/51 |
| 3,683,306 | 8/1972 | Bulthuis et al. | 357/91 |
| 3,683,491 | 8/1972 | Nelson et al. | 357/28 |
| 3,730,787 | 5/1973 | Murphy | 357/91 |
| 3,796,929 | 3/1974 | Nicholas et al. | 357/51 |
| 3,860,465 | 1/1975 | Matzner et al. | 357/51 |
| 3,885,999 | 5/1975 | Fusaroli et al. | 357/35 |
| 3,902,926 | 9/1975 | Perloff et al. | 357/91 |
| 3,947,866 | 3/1976 | Stellrecht | 357/91 |
| 3,990,092 | 11/1976 | Yoshimura | 357/51 |
| 4,001,869 | 1/1977 | Brown | 357/51 |

Primary Examiner—Andrew J. James
Attorney, Agent, or Firm—Theodore F. Neils

[57] ABSTRACT

A precision sensistor structure is disclosed for use in a monolithic integrated circuit.

7 Claims, 2 Drawing Figures

SENSISTOR APPARATUS

BACKGROUND OF THE INVENTION

The invention herein relates to precise, temperature sensistive resistors and, in particular, to precise sensistors formed in monolithic integrated circuits.

The use of sensistors for temperature compensation in electronic circuits is well known. Such devices are impurity-doped semiconductors which exhibit a positive temperature coefficient of resistance. As discrete circuit devices, sensistors are widely available.

However, providing sensistors in a monolithic integrated circuit is a more difficult problem because of constraints inherent in the construction of monolithic integrated circuits limiting the methods to be used for fabrication of, and the resulting structures of, such sensistor devices. Particularly important in providing such monolithic integrated circuits sensistors is the temperature coefficient of resistance and the voltage coefficient of resistance resulting for the completed sensistor units.

SUMMARY OF THE INVENTION

A monolithic integrated circuit sensistor is disclosed having a temperature coefficient of resistance determined by selecting the concentration of implanted ions therein which determine the conductivity type of the resistive region in the integrated circuit forming the sensistor. The voltage coefficient of resistance can be reduced below any desired value by providing the sensistor as a series string of resistive regions thereby allocating the total sensistor resistance into enough separate resistive regions to reduce the voltage coefficient to the extent desired.

DESCRIPTION OF THE PREFERRED EMBODIMENTS

FIGS. 1 show the results of steps performed in fabricating a sensistor having a desired temperature coefficient of resistance. FIG. 1A shows a portion of what will become a monolithic integrated circuit at the beginning of its fabrication process, the structure starting with a silicon substrate, 10, which is provided having a p-type conductivity. Substrate 10 has a resistivity of approximately 2 to 7 $\Omega$-cm. Thereupon, substrate 10 is provided with an epitaxial layer, 11, of n-type conductivity. Epitaxial layer 11 is grown by standard techniques and is doped to have a resistivity of 1.5 $\Omega$-cm. Prior to growing epitaxial layer 11, provision for a buried layer region is made by a diffusion made into substrate 10. During growth of epitaxial layer 11, a fully formed buried layer region, 13, develops having an $n^+$-type conductivity. After growth of the epitaxial layer 11 on substrate 10, a silicon dioxide ($SiO_2$) masking layer, 14, is thermally grown on an exposed outer major surface, 15, of epitaxial layer 11.

Figure 1A:
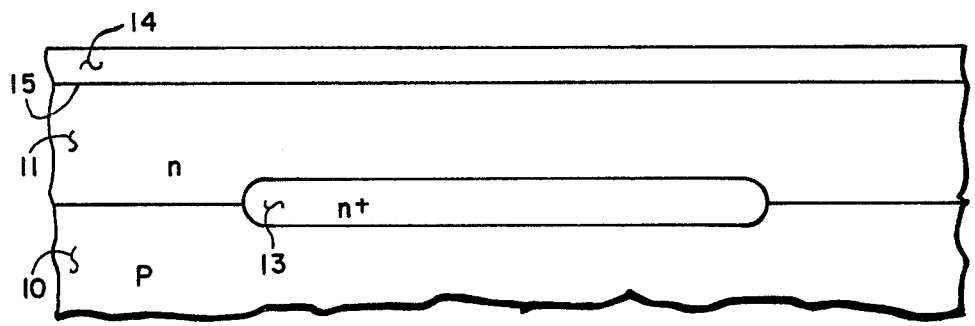
FIG. 1 shows the results of a series of steps performed in providing the present invention.
Figure 1B:
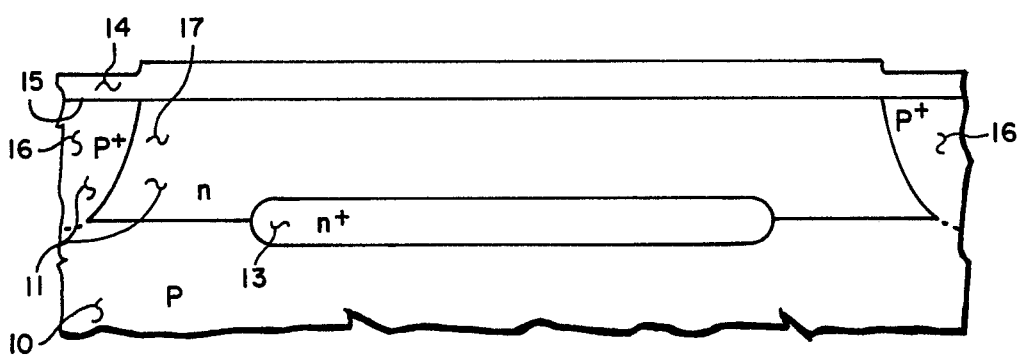

$SiO_2$ layer 14 first serves as a diffusion mask for an isolation diffusion step which separates portions of epitaxial layer 11 into electrically isolated regions which will eventually contain circuit device components. A photoresist masking layer is provided as an etching mask for providing openings in $SiO_2$ layer 14 in a standard photoresist process, the photoresist layer to serve a mask to define openings in layer 14 by being relatively unaffected by the etchant used to etch away the portions of layer 14 uncovered by the photoresist mask. Layer 14 is etched away where open to the etchant thereby exposing surface 15 over those selected portions of epitaxial layer 11 which are to receive the isolating diffusion and the structure is then subjected to a diffusion of the dopant boron to form $p^+$-type conductivity isolating regions. The result of this diffusion is shown in FIG. 1B where isolating regions, 16, are shown for electrically isolating a portion of epitaxial layer 11 to form an isolated region, 17. This is a typical structure in pn junction isolated monolithic integrated circuits. As shown in FIG. 1B, the openings in $SiO_2$ layer 14 allowing the formation of isolating regions 15 have $SiO_2$ regrown in these openings to once again provide a continuious layer of $SiO_2$.

Figure 1C:
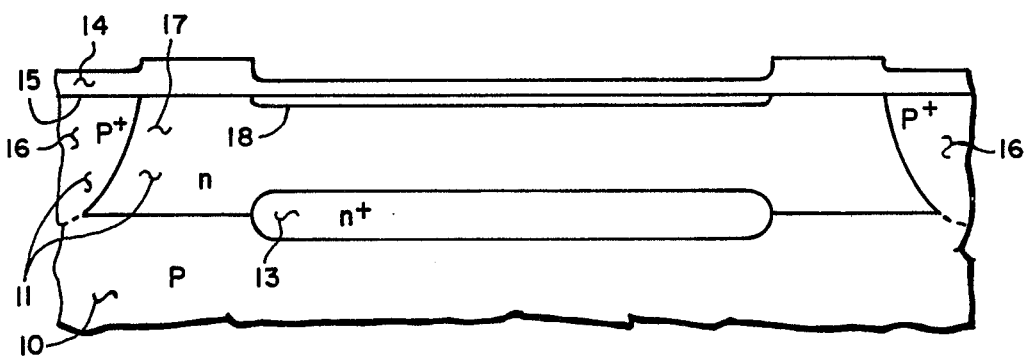

Thereafter, another opening is provided in $SiO_2$ layer 14 above isolated region 17 to expose surface 15 in a selected location, below which the resistor to serve as a sensistor is to be provided. After this exposure of surface 15, there is grown 750 A over the exposed portion of layer 15 to serve as a scattering layer for a subsequent ion implantation step to cause some scattering of the impinging ions so that they do not happen to line up with the silicon lattice in layer 11 and go much deeper than expected for a given ion energy. This completed, the ion implantation step is undertaken. At an energy of 80 kev, boron ions are implanted through the scattering oxide with a dose of $1.2 \cdot 10^{13}$ ions/cm$^2$ in a predeposition step preparatory to a subsequent diffusion step. The predisposed boron ions, 18, are shown in FIG. 1C below the scattering layer portion formed in $SiO_2$ layer 14.

The choice of a dose for the implantation step determines both the temperature coefficient of resistance in the resulting resistor, or sensistor, as well as the resistivity or sheet resistance, of the region which is to form this sensistor. For a given shape eg. lengths and widths, in surface 15 of the exposed portion of epitaxial layer 11 subject to the impinging ions in the implantation steps, this exposure determined by the shape of the scattering layer as surrounded by the thicker portions of layer 14, the total resistance value for the sensistor to be formed in region 17 is also determined subject to further processing steps. That is to say, once a temperature coefficient of resistance is selected the value of the resistor can be controlled primarily only through the shape and size in surface 15 over the region of the epitaxial layer 11 subjected to receiving the implanted ions. In effect, this means that both the temperature coefficient of resistance and the absolute value of the resistance of the sensistor can be independently controlled to a substantial degree in the formation of a sensistor in an isolated region. Hence, different doses will lead to different temperature coefficients of resistance which can reasonably be provided in a range of from near 0.0%/° C to around 1.0%/° C. With the dose chosen above, $1.2 \cdot 10^{13}$ ions/cm$^2$, the temperature coefficient of resistance at room temperature will be approximately 0.68%/° C.

The above mentioned diffusion step is next performed. This diffusion, leading to the near final formation of the sensistor region in the monolithic integrated circuit, is part of the base diffusion step used in forming base regions for bipolar transistors being simultaneously provided with the sensistor in the integrated circuit.

Although such bipolar transistors need not be provided in the same monolithic integrated circuit, they often are and the sensistor diffusion and base region diffusion steps can be combined into the same step. In performing this diffusion step, a further photoresist layer to mask layer 14 is provided as an etching mask to allow the etching of openings in layer 14 exposing the ends of boron ion predeposition 18. That is, layer 14 is opened to expose surface 15 at approximately the ends of the scattering oxide, and adjacent thereto, to expose layer 15 below adjoining areas of the thicker oxide portions of layer 14. This is done so that, during the base diffusion step, end regions for the region 17 sensistor of a higher conductivity will be simultaneously formed for the purpose of allowing ohmic contacts to be made to the finished sensistor by the metallization interconnection network to be later provided. These regions formed at the ends of the finished sensistor through the base diffusion, having a higher conductivity, permit good low resistance ohmic contacts to be made to the sensistor by the interconnection network.

Figure 1D:
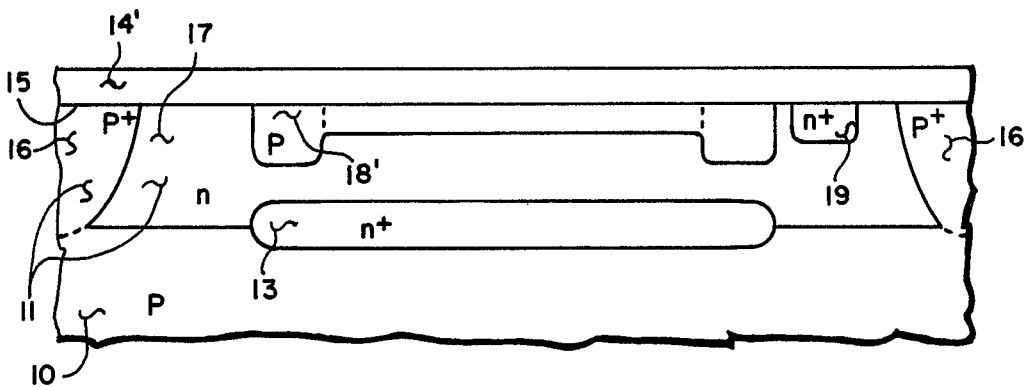

The diffusion step is carried out in a boron atmosphere which, for those parts of surface 15 exposed at the end portions of predeposition 18, serves as the diffusant source for the diffusion forming the higher conductivity end regions of the sensistor. Of course, predeposition region 18 of implanted ions serves as the diffusant source for the rest of the sensistor between the end regions. The result of the diffusion step is shown in FIG. 1D where the sensistor region has been redesignated 18'. This result in FIG. 1D is accomplished by continuing the diffusion for 55 minutes at 1100° C in, as stated, a boron atmosphere as part of the base diffusion step. The pn junction between the resistor 18' and isolated region 11 occurs, in locations away from the end regions, at approximately 2.5 μm below surface 15.

After the diffusion step, a photoresist layer is again used to mask SiO$_2$ layer 14 for etching to provide an opening therein to expose surface 15 for a further diffusion step carried out in conjunction with the emitter region diffusion used in the simultaneous formation of bipolar transistors in the monolithic integrated circuit chip. In this second diffusion step, a contact region, 19, is formed in isolated region 17 so that a good ohmic contact can be made to this region by the later formed metallization interconnection network. This second diffusion step is performed using standard diffusion techniques well known to those skilled in the art and the result is also shown in FIG. 1D. Further shown in FIG. 1D is the result of removing SiO$_2$ layer 14 after completion of the diffusion steps and replacing it with a new SiO$_2$ layer 14' having a smooth surface to support the metallization interconnection network to be later provided.

Figure 1E:
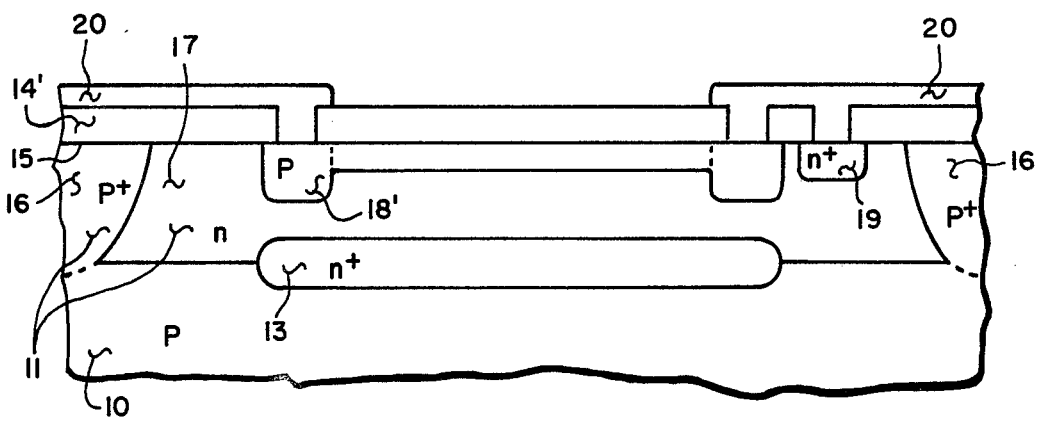

The result of providing the metallization interconnection network, which is accomplished through the use of standard processing steps, is shown in FIG. 1E. Portions of the metallization interconnection network shown are all designated by the numeral 20. As can be seen from FIG. 1E, the right-hand portion of metallization interconnection network 20 shows that the one end of the sensistor region 18' is directly electrically shorted to isolated region 17 through contact region 19. This end of the sensistor will be at the higher voltage potential in operation as compared with the voltage potential of the other end of the sensistor to thereby prevent any forward biasing occurring along the pn junction separating region 18' from isolated region 17. In the final structure shown in FIG. 1E, buried layer 13 is provided primarily for reducing parasitic pnp transistor action occurring in the monolithic integrated circuit portion involving isolated region 17.

As indicated above, the implanted dose of boron ions and the subsequent diffusion cycle will determine the sheet resistance of the sensistor region 18'. While, as noted at that point, the total resistance and the temperature coefficient of resistance can be independently determined to a substantial degree for the sensistor shown in FIG. 1E, the voltage coefficient of resistance for that sensistor must be taken as it results from the processing. That is, the change in the total resistance value of sensistor region 18' of FIG. 1E with changes in the voltage drop thereacross in operation must be accepted for that sensistor as this voltage coefficient cannot be controlled independently of total resistance value and the temperature coefficient. This voltage coefficient of resistance can be quite significant for a sensistor as usually the temperature coefficient of resistance is of primary importance and its selection often leads to a sensistor having relatively low doping, i.e. high resistivity, leading to a substantial voltage coefficient value and the temperature coefficient.

The source of a substantial voltage coefficient of resistance for the sensistor region 18' of the FIG. 1E and how the choice of sensistor region resistivity, or sheet resistance, determines the voltage coefficient for a sensistor region can be easily shown. Consider the well known equation for sheet resistance of a resistor region, or sensistor region, derived on the basis of the step junction approximation which is as follows:

$$R_S = \frac{1}{q\mu_h N_A [x_j - \frac{N_D}{N_A} (\frac{2K_S \epsilon_O}{q N_D} V)^{\frac{1}{2}}]},$$

where symbols in the above equation stand for the following:
$R_S$: sheet resistance
$q$: electronic charge
$\mu_h$: hole mobility
$N_A$: acceptor concentration in sensistor region
$N_D$: donor concentration in solated region or epitaxial layer outside sensistor region
$x_j$: junction depth of main portion of sensistor region
$K_S$: dielectric constant of silicon
$\epsilon_O$: permittivity of free space
$V$: reverse bias voltage along pn junction separating sensistor from the isolated region, i.e., the voltage drop across the sensistor with its high potential end shorted to the isolated region.

As can be seen from the above equation, the sheet resistance depends on the voltage drop across the sensistor. Since the total resistance of the sensistor region (ignoring end region corrections) can be written:

$$R = R_S(L/W),$$

where $L$ is the length between the contacts of the sensistor and $W$ is the width of the sensistor in the surface through which it is formed, the total resistance of the sensistor region is clearly a function of the voltage drop across this region leading to a voltage coefficient of resistance.

Such a voltage coefficient is often an undesirable feature in circuits because a sensistor is very typically used in a sensitive voltage divider or a bridge network provided in a compensating scheme for some temperature dependence of an electronic circuit but where this circuit is not similarly voltage dependent. Thus, when the voltage supplied to the sensistor portion of the circuit can vary, say due to typical supply voltage variations, an undesirable voltage dependence can be introduced in the electronic circuit through the voltage coefficient of resistance in the sensistor. Hence, reducing or eliminating this voltage coefficient of resistance in the sensistor is highly desirable as it may be for other kinds of monolithic integrated circuit resistors.

While independent control of the voltage coefficient of resistance is to a substantial degree not possible for the single sensistor region shown in FIG. 1E, this voltage coefficient can be reduced to any desired value through the use of multiple sensistor regions electrically joined in series to form a complete sensistor. This can be seen by combining the foregoing equations and considering the result of dividing the sensistor region 18' of FIG. 1E into $n$ equal parts between the contact regions therein and isolating from one another each of these regions resulting from the division by putting each in a separate isolation region. That is, $n$ replicas of FIG. 1E will be constructed each having a length of $L/n$ with each of these smaller sensistor regions joined electrically in series with one another. Combining the two above equations yields, for a single sensistor region, $$R = \frac{1}{q\mu_h N_A [x_j - \frac{N_D}{N_A}(\frac{2K_S \epsilon_O}{q N_D} V)^{\frac{1}{2}}]} \frac{L}{W}.$$

Dividing the sensistor into $n$ equal parts as indicated above means that for any one of the smaller sensistor regions the total resistance will be $R/n$, the length will be $L/n$ and the voltage drop across the smaller sensistor region will be $V/n$. Thus, for any one of the smaller sensistor regions resulting from the division, the following equation will hold:

$$\frac{R}{n} = \frac{1}{q\mu_h N_A [x_j - \frac{N_D}{N_A}(\frac{2K_S \epsilon_O}{q N_D} \frac{V}{n})^{\frac{1}{2}}]} \frac{\frac{L}{n}}{W}.$$

Since all of the smaller sensistor regions are to be electrically joined in series, the resistance total for the series string of resistor regions, i.e. series string of smaller sensistor regions, will be $n$ times that of any one of the smaller sensistor regions leading to $$n\frac{R}{n} = R = \frac{n}{q\mu_h N_A [x_j - \frac{N_D}{N_A}(\frac{2K_S \epsilon_O}{q N_D} \frac{V}{n})^{\frac{1}{2}}]} \frac{\frac{L}{n}}{W}$$

$$= \frac{1}{q\mu_h N_A [x_j - \frac{N_D}{N_A}(\frac{2K_S \epsilon_O}{q N_D} \frac{V}{n})^{\frac{1}{2}}]} \frac{L}{W}.$$

Clearly, the voltage dependence of the resistance of the composite sensistor, comprising the electrically-joined-in-series smaller resistor regions has been reduced by introducing the factor $V/n$ in place of the factor $V$ in the equation for a single sensistor region. By increasing the value of $n$ appropriately, the voltage coefficient of resistance can be reduced to smaller value as desired.

Figure 2:
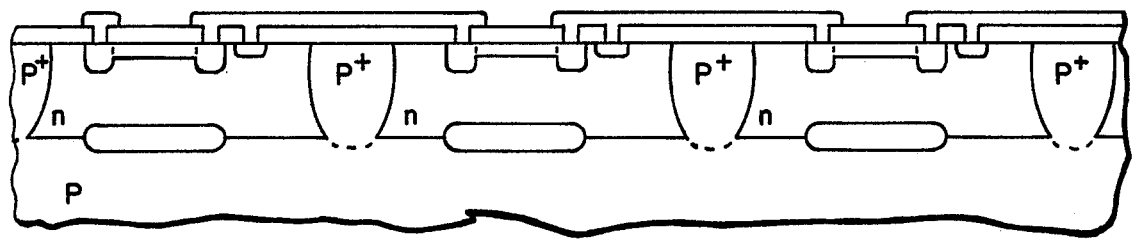
FIG. 2 shows another version of the structure of the present invention.

FIG. 2 shows the result in a monolithic integrated circuit of providing a sensistor comprised of three smaller sensistor regions, i.e. $n = 3$. Each of these smaller sensistor regions is formed simultaneously with one another in just the manner that the sensistor region of FIG. 1E was formed. Obviously, $n$ could be increased to any number of regions necessary to bring the voltage coefficient resistance down to an acceptable value for the particular circuit application involved. As an example, for a total sensistor resistance of 6 $k\Omega$ and a temperature coefficient resistance of 0.68% with $n = 8$, the voltage coefficient of resistance will be only 0.35%/volt rather than 1.20%/volt as it was for the sensistor of FIG. 1E.

The embodiments of the invention which exclusive property or right is claimed are defined as follows:

1. A monolithic integrated circuit sensistor, provided in a semiconductor material and having a selected total resistance and a selected temperature coefficient of resistance, said sensistor comprising:

an isolated region in said semiconductor material having a first conductivity type;

a resistor region of a second conductivity type which is determined by ions implanted therein in a selected dose to provide said temperature coefficient of resistance having a value other than substantially zero, said resistor region being located in said isolated region with a semiconductor junction occurring between said resistor region and said isolated region; and an interconnection network means adapted to electrically connect said resistor region into a circuit.

2. The apparatus of claim 1 wherein said isolated region has a buried layer region provided between it and a substrate on which said isolated region is formed, said buried layer region being of said first conductivity type.

3. The apparatus of claim 2 wherein said isolated region is formed in an epitaxial layer grown on said substrate.

4. The apparatus of claim 1 wherein said resistor region has a substantially uniform thickness at least away from edges thereof.

5. The apparatus of claim 1 wherein said semiconductor material contains at least one other isolated region with said other isolated region containing an active device having at least one diffused region therein; and wherein said isolated region containing said resistor region also contains at least one diffused contact region located to overlap a portion of said resistor region with said interconnection network means being in ohmic contact with said diffused contact region, each of said diffused contact region, said diffused active device region and said resistor region having an extent and a dopant distribution jointly determined, at least in part, by a common diffusion.

6. The apparatus of claim 5 wherein said resistor region has a substantially uniform thickness possibly excepting near edges thereof.

7. The apparatus of claim 1 wherein said selected total resistance is further determined by a selected shape and size of said resistor region.

* * * * *